(12) United States Patent
Bill et al.

(10) Patent No.: US 6,324,108 B1
(45) Date of Patent: Nov. 27, 2001

(54) APPLICATION OF EXTERNAL VOLTAGE DURING ARRAY VT TESTING

(75) Inventors: Colin S. Bill, Cupertino; Edward V. Bautista, Jr., Santa Clara; Shigekazu Yamada, Cupertino, all of CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/667,891

(22) Filed: Sep. 22, 2000

Related U.S. Application Data

(60) Provisional application No. 60/186,167, filed on Feb. 29, 2000.

(51) Int. Cl.[7] .................................................. G11C 7/00
(52) U.S. Cl. ................ 365/201; 365/230.06; 365/185.09
(58) Field of Search ............................. 365/201, 185.09, 365/185.24, 230.06

(56) References Cited

U.S. PATENT DOCUMENTS 6,088,281 * 8/2000 Miyakawa ........................ 365/225.7
6,111,792 * 8/2000 Oku ................................. 365/185.33

* cited by examiner

*Primary Examiner*—A. Zarabian

(57) ABSTRACT

When an array VT test mode is entered, a predetermined wordline voltage is generated by a wordline voltage supply and supplied to at least one decoder circuit and a voltage control logic circuit. The voltage control logic circuit generates a predetermined control voltage that is directed to the decoder circuits. The predetermined control voltage activates the decoder circuits. A particular decoder circuit is electrically selected to decode at least one respective wordline and transfer the predetermined wordline voltage to the respective wordline. The activated decoder circuits that are not electrically selected are not forward-biased.

24 Claims, 3 Drawing Sheets

APPLICATION OF EXTERNAL VOLTAGE DURING ARRAY VT TESTING

This application claims the benefit under 35 U.S.C. §119(e) of Provisional U.S. patent application Ser. No. 60/186,167, filed on Feb. 29, 2000.

FIELD OF INVENTION

The present invention relates generally to non-volatile memory devices and, more particularly, to a method and system of applying an externally supplied voltage to a plurality of wordlines during array VT testing in flash electrically erasable programmable read-only memory (EEPROM) devices.

BACKGROUND OF THE INVENTION

Flash memories are popular memory storage devices because they store information in the absence of continuous power and are capable of being constructed in a very compact form. Flash memory is typically constructed by fabricating a plurality of floating-gate transistors in a silicon substrate. A floating-gate transistor is capable of storing electrical charge on a separate gate electrode known as a floating gate that is separated by a thin dielectric layer from a control-gate electrode. Generally speaking, data is stored in a non-volatile memory device by the storage of an electrical charge in the floating gate.

Flash memories are in the form of a memory array that includes rows and columns of flash transistors, with each transistor being referred to as a memory cell that includes a control gate, a drain and a source. The control gates of the memory cells in each row of a sector are typically electrically interconnected to form wordlines such that a wordline decoder can direct a plurality of operational voltages to the wordlines. The drains of the memory cells in each column of a sector are typically electrically interconnected to form bitlines such that a bitline decoder directs a plurality of operational voltages to the bitlines. Generally, the sources of the memory cells in a sector are electrically interconnected to form a common sourceline and are controlled by a sourceline controller. As known in the art, the memory array is subdivided into sectors containing rows and columns of memory cells.

To program a respective memory cell in the flash memory, the control gate (wordline) and drain (bitline) of the memory cell to be programmed are raised to predetermined programming voltages and the source is grounded. When the predetermined programming voltages are removed, a negative charge on the floating gate is maintained. In contrast to the programming procedure, flash memory devices are typically bulk-erased, so that all of the memory cells on a predetermined number of bitlines and wordlines are simultaneously erased by applying predetermined voltages to the bitlines, the wordlines and the sourceline.

In order to read a particular memory cell, a voltage called the threshold voltage of the cell is measured to determine if the cell is in a charged (programmed) or an uncharged (unprogrammed) state. Memory cells are read by applying a predetermined voltage to the wordline and the bitline, grounding the sourceline and then sensing the current on the bitline, If the memory cell is programmed, the threshold voltage will be relatively high and the bitline current will be zero, or at least relatively low, when the predetermined voltage is applied between the control gate and the drain of the memory cell. If the memory cell is not programmed, the threshold voltage will be relatively low and the bitline current will be relatively high when the predetermined voltage is applied.

During fabrication of the flash memory, functional testing is performed to verify proper operation and to characterize the memory cells to determine the threshold voltage in an un-programmed and a programmed state. Characterization of the memory cells generally involves verifying the operating margins and determining the current-to-voltage relationship of the un-programmed and programmed memory cells. As known in the art, the current-to-voltage characterization of the memory cells depends on parameters established during fabrication. These parameters include the geometry (physical dimensions) of the memory cells, the doping concentrations of the source and drain diffusion regions and oxide thickness.

When functional testing is initiated to determine the current-to-voltage characteristic of a selected memory cell, predetermined voltages are applied to the bitline decoder, the wordline decoder and the sourceline controller. The selected memory cell is then read by sensing any bitline current that is present due to the predetermined voltages applied. The current-to-voltage characteristic is typically developed by varying the predetermined voltage applied to the wordline decoder in a predetermined range while sensing the bitline current of the selected memory cell.

In the prior art methods and systems of performing testing to characterize the current-to-voltage characteristic of the memory cells, a known problem occurs when the predetermined range of voltage applied to the wordline decoder includes magnitudes of voltage that are less than a supply voltage (Vcc). When a magnitude of voltage less than the supply voltage (Vcc) is supplied to a selected wordline decoder electrically connected with the selected memory cell, the voltage is also applied to unselected wordline decoders electrically connected with unselected memory cells. The unselected wordline decoders are damaged if a forward bias condition is created within the unselected wordline decoders. The forward bias condition is created when the unselected wordline decoders are exposed to magnitudes of voltage that are less than the supply voltage (Vcc) and the supply voltage (Vcc) at the same time.

To that end, a need exists for methods and systems of applying a predetermined range of voltage to a plurality of wordline decoders that allow the selected wordline decoder to transfer the voltage to the wordlines while not damaging the unselected wordline decoders that are exposed to the predetermined range of voltage.

SUMMARY OF THE INVENTION

The preferred embodiment of the invention discloses methods and systems for use in developing the current-to-voltage characteristic of a selected memory cell in a flash memory. The preferred flash memory includes a voltage control logic circuit, at least one decoder circuit and at least one wordline. A wordline voltage supply is electrically connected with the voltage control logic circuit and the decoder circuit. The decoder circuit is electrically connected with the wordline. Those skilled in art would recognize that the number of decoder circuits and wordlines varies with the storage capacity of the flash memory.

When an array VT test mode is entered, the wordline voltage supply is set to generate a predetermined wordline voltage that is supplied to the voltage control logic circuit and the decoder circuits. As known in the art, during array VT testing, selected memory cells that are electrically connected with the wordlines are read and the current flow sensed to obtain the current-to-voltage characterization of the selected memory cells. To read a selected memory cell in a particular wordline, a predetermined control voltage is generated by the voltage control logic circuit and directed to the decoder circuits. The control voltage controls the magnitude of a supply voltage (Vcc) that activates the decoder circuits. A decoder circuit that is one of the decoder circuits activated by the control voltage is electrically selected to transfer the wordline voltage to the particular wordline and the selected memory cell is read.

The wordline voltage that is generated by the wordline voltage supply and supplied to the voltage control logic circuit and the decoder circuits is controlled externally. The magnitude of the wordline voltage is varied within a first predetermined voltage range to develop the current-to-voltage characterization of the respective memory cell. The magnitude of the control voltage that is generated by the voltage control logic circuit and used to activate the decoder circuits using the supply voltage (Vcc) also varies within a second predetermined voltage range. The second voltage range corresponds to the magnitude of the wordline voltage that is supplied to the decoder circuits by the wordline voltage supply circuit.

The control voltage is varied to a magnitude that allows activation of the selected wordline decoder circuit at a predetermined activation voltage. The activation voltage is generated by controlling the magnitude of the supply voltage (Vcc). The activation voltage is equal to a magnitude of voltage that will not create a forward bias condition on unselected wordline decoder circuits that are similarly activated. The forward bias condition can occur on the unselected wordline decoder circuits since the predetermined activation voltage and the predetermined wordline voltage are applied to both the selected and unselected decoder circuits. As known in the art, the forward bias condition can activate diodes within the decoder circuits creating a leakage current that can compromise reliable operation of the flash memory.

The preferred wordline voltage supply is an external power supply that is capable of being varied from about 1.2 to 6 V. The supply voltage (Vcc) varies from about 4.5 V to 5.5 V in the preferred embodiment and is used to activate the decoder circuits. Since the activated decoder circuits are subjected to the supply voltage (Vcc) and the wordline voltage, the magnitude of the supply voltage (Vcc) is controlled to allow activation of the decoder circuits without causing forward biasing in the unselected decoder circuits. To avoid forward biasing of the unselected decoder circuits, the wordline voltage is sensed by the voltage control logic circuit and the control voltage is generated based on the wordline voltage. The control voltage activates the decoder circuits by controlling the magnitude of the supply voltage (Vcc) to generate a predetermined activation voltage.

The preferred voltage control logic circuit is capable of generating a minimum control voltage that is set to approximately sixty percent of the voltage level of the supply voltage (Vcc). The minimum control voltage allows the transfer of a corresponding minimum predetermined activation voltage that will activate the decoder circuits without causing forward bias problems. Whenever the magnitude of the wordline voltage supplied by the wordline voltage supply is less than the minimum control voltage, the voltage control logic circuit generates the minimum control voltage to activate the decoder circuits.

When the magnitude of the wordline voltage that is supplied by the wordline voltage supply is at or above the minimum control voltage, the magnitude of the control voltage that is generated by the voltage control logic circuit is approximately equal to the wordline voltage supplied by the wordline voltage supply. If the magnitude of the wordline voltage supplied by the wordline voltage supply is at or above one hundred percent of the supply voltage (Vcc), about one hundred percent of the magnitude of the supply voltage (Vcc) is generated by the voltage control logic circuit as the predetermined control voltage. Those skilled in the art would recognize that since the supply (Vcc) is supplied to both the voltage control logic circuit and the decoder circuits, operational fluctuations in the magnitude of supply voltage (Vcc) will not affect activation of the decoder circuits because each device will adjust accordingly.

Another preferred embodiment of the present invention discloses a wordline decoding system used to transfer predetermined voltages to a plurality of wordlines during array VT testing in a flash memory. This preferred embodiment of the present invention includes a flash memory that is electrically connected with a wordline voltage supply. The preferred flash memory includes at least one decoder circuit, a voltage control logic circuit and at least one wordline. During the array VT test mode, the wordline voltage supply generates a predetermined wordline voltage that is supplied to the decoder circuits and the voltage control logic circuit. The decoder circuits are activated to transfer the wordline voltage to the wordlines with a predetermined control voltage that is generated by the voltage control logic circuit. The wordline voltage and the control voltage are capable of being varied as set forth in the previous preferred embodiment without causing forward bias.

These and other features and advantages of the invention will become apparent upon consideration of the following detailed description of the presently preferred embodiments of the invention, viewed in conjunction with the appended drawings.

DETAILED DESCRIPTION OF THE INVENTION

The exemplary embodiments of the invention are set forth below with reference to specific configurations, and those skilled in the art would recognize that various changes and modifications could be made on the specific configurations while remaining within the scope of the claims. The invention may be used with any type of memory device that requires array VT testing; however, the preferred embodiment of the invention is designed for a flash memory. All electrical parameters are given by example only and could be modified for use with various memory devices using other electrical parameters. For example, in the preferred embodiment, a supply voltage (Vcc) is considered as nominally 5 V, but could alternatively be 3.3 V, 1.8 V or some other supply voltage. If a different supply voltage is chosen, the various operational levels would be modified to accommodate the different supply voltage, as known in the art.

Figure 1:
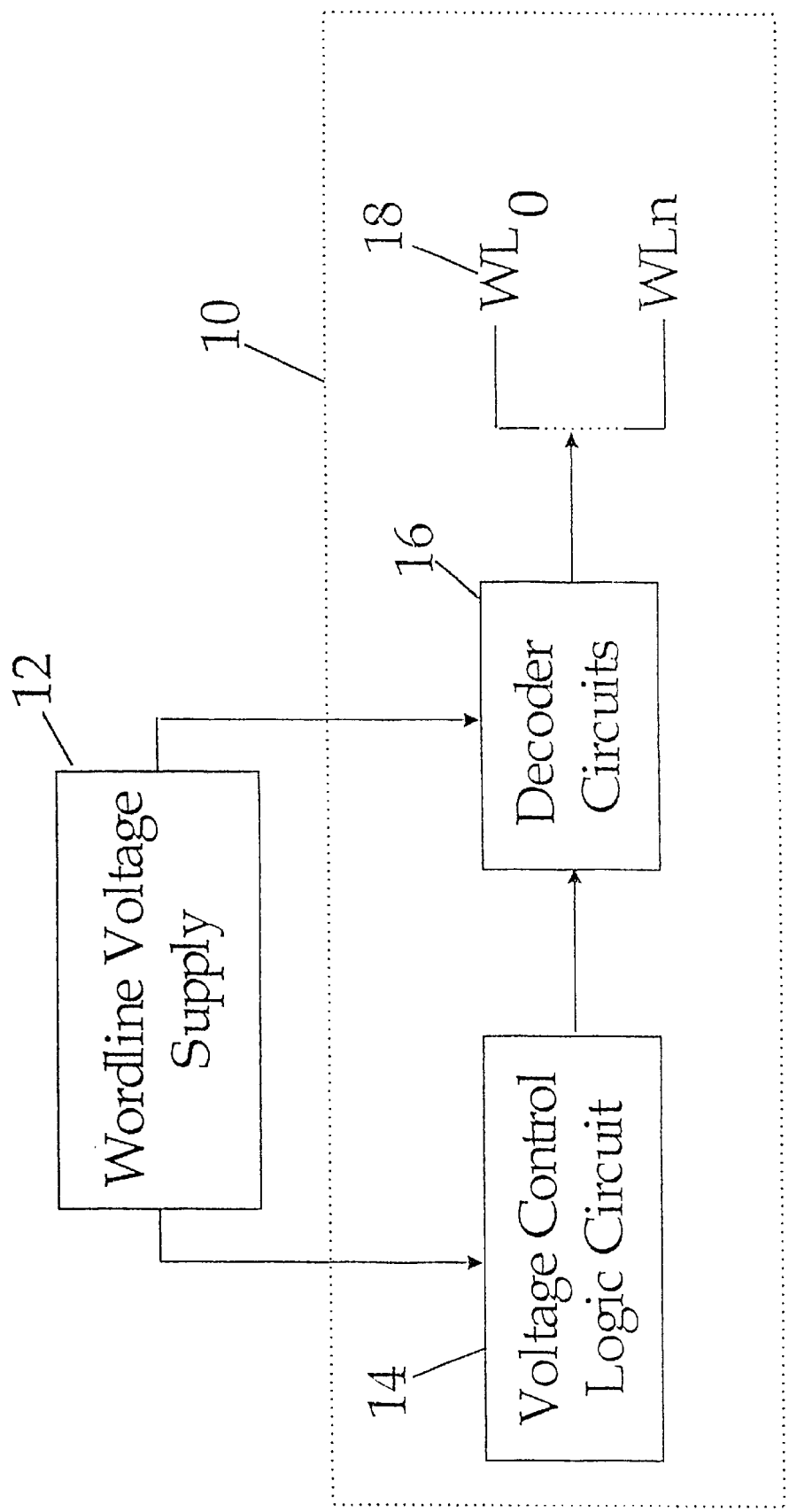
FIG. 1 represents a block diagram of a portion of a preferred flash memory electrically connected with a wordline voltage supply.

FIG. 1 illustrates a block diagram of a portion of a flash memory 10 that is electrically connected with a wordline voltage supply 12. The preferred flash memory 10 includes a voltage control logic circuit 14, at least one decoder circuit 16 and at least one wordline 18. The wordline voltage supply 12 is electrically connected with the voltage control logic circuit 14 and the decoder circuits 16. The voltage control logic circuit 14 is electrically connected with the decoder circuits 16 and the decoder circuits 16 are electrically connected with the wordlines 18. Those skilled in art would recognize that the number of decoder circuits 16 and wordlines 18 varies with the storage capacity of the flash memory 10.

During operation, when the preferred flash memory 10 is placed in an array VT test mode, the wordline voltage supply 12 generates a predetermined wordline voltage that is supplied to the voltage control logic circuit 14 and the decoder circuits 16. As known in the art, during array VT testing, selected memory cells (not shown) in the wordlines 18 are read and the current flow sensed to obtain the current-to-voltage characterization of the memory cells. To read a selected memory cell on a particular wordline 18, a predetermined control voltage is generated by the voltage control logic circuit 14 and directed to the decoder circuits 16. The control voltage controls the magnitude of a supply voltage (Vcc) (not shown) that is used to activate the decoder circuits 16. A decoder circuit 16 that is one of the decoder circuits 16 activated by the control voltage is electrically selected to decode respective wordlines 18 in the flash memory 10. Once decoding is complete, the selected decoder circuit 16 transfers the predetermined wordline voltage to the respective wordline 18.

The wordline voltage that is generated by the wordline voltage supply 12 and supplied to the voltage control logic circuit 14 and the decoder circuits 16 is controlled externally. The magnitude of the wordline voltage can be varied within a first predetermined range to develop the characterization of the memory cells in the wordlines 18. The magnitude of the control voltage that is generated by the voltage control logic circuit 14 to activate the decoder circuits 16 using the supply voltage (Vcc) correspondingly varies within a second predetermined range. The magnitude of the control voltage corresponds to the magnitude of the wordline voltage that is supplied to the respective decoder circuits 16 by the wordline voltage supply 12.

The control voltage is varied to a magnitude that allows the selected wordline decoder circuit 16 to be activated at a predetermined activation voltage. The activation voltage is generated by controlling the magnitude of the supply voltage (Vcc). The activation voltage is a magnitude of voltage that will not create a forward bias condition within the unselected decoder circuits 16 that are similarly receiving the control voltage. The forward bias condition can occur on the unselected wordline decoder circuits 16 since the activation voltage and the wordline voltage is applied to both the selected and unselected decoder circuits 16. As known in the art, the forward bias condition can activate diodes within the decoder circuits 16 such that a leakage current will occur that can compromise reliable operation. By varying the magnitude of the supply voltage (Vcc) to correspond to the wordline voltage that is generated, the selected decoder circuit 16 can decode the wordlines 18 that include the memory cells to be characterized while the unselected decoder circuits 16 that are also activated are not placed in forward-biased condition.

The preferred wordline voltage supply 12 is an external power supply that is capable of being varied within the first predetermined range, which varies from about 1.2 to 6 V. In addition, the preferred flash memory 10 is operated with the supply voltage (Vcc) (not shown) which can typically vary from about 4.5 to 5.5 V. Those skilled in the art would recognize that the wordline voltage supply 12 and the supply voltage (Vcc) could be formed from a variety of readily available, widely known power supplies. In the preferred embodiment of the present invention, those skilled in the art would understand that the magnitude of voltage generated by the wordline voltage supply 12 is capable of being manually varied and directed to the voltage control logic circuit 14 and the decoder circuits 16.

Figure 2:
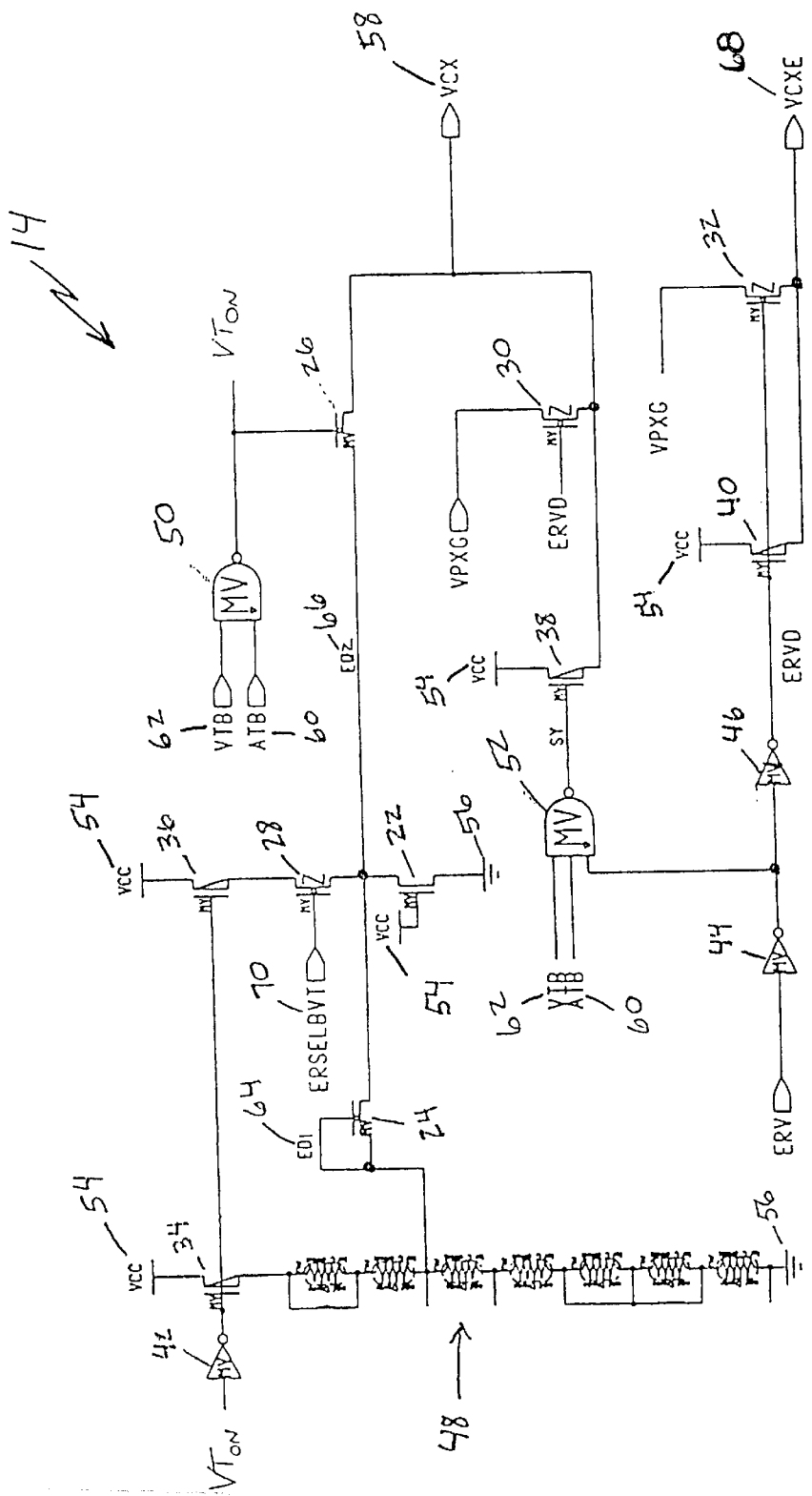
FIG. 2 represents a circuit schematic of a voltage control logic circuit of the preferred embodiment of the present invention.

FIG. 2 illustrates a circuit schematic of the preferred voltage control logic circuit 14. The preferred voltage control logic circuit 14 includes an n-channel transistor 22, a plurality of low-threshold n-channel transistors 24–26, a plurality of z-device n-channel transistors 28–32, a plurality of p-channel transistors 34–40, a plurality of inverters 42–46, a resistor chain 48 and a plurality of band gates 50–52 that are electrically connected as illustrated in FIG. 2. The preferred voltage control logic circuit 14 is also electrically connected with a supply voltage (Vcc) 54 and a ground connection 56 as illustrated.

During operation, the voltage control logic circuit 14 generates the control voltage within the second predetermined range on a control voltage line (VCX) 58. The preferred voltage control logic circuit 14 is activated by a conducting electric signal generated on an array Vt mode line (VTB) 62 and a non-conducting electric signal generated on an array VT distribution mode line (ATB) 60. Voltages applied to the flash memory 10 on a plurality of external pins (not shown) by a user during the array VT test mode generate the conducting and non-conducting electric signals.

The array VT test mode is a manual test mode to allow characterization of the memory cells. During the array VT test mode, the user selectively applies predetermined voltages to the plurality of external pins to generate corresponding predetermined electric signals. The predetermined electric signals are directed to a plurality of signal lines within the flash memory 10 that correspond to the plurality of external pins. Manual application of the predetermined electric signals activates the flash memory 10 to perform operations associated with the array VT test mode at the direction of the user. Those skilled in the art would recognize that a detailed discussion regarding the plurality of external pins is beyond the scope of the present invention.

The array VT mode line (VTB) 62 begins conducting to activate low-threshold n-channel transistor 26, p-channel transistor 34 and p-channel transistor 36 when the array VT test mode is entered. The array VT distribution mode line (ATB) 60 begins conducting when another test mode is entered that is beyond the scope of the present invention. For purposes of the present invention, it is sufficient for those skilled in the art to understand that the array VT distribution mode line (ATB) 60 will remain non-conducting during the array VT test mode.

When the voltage control logic circuit 14 is activated, the resistor chain 48 operates as a resistor-based voltage divider to create a magnitude of voltage on a first internal node (ED1) 64 that is about sixty percent of the supply voltage (Vcc). Those skilled in the art would recognize that the resistor chain 48 is a series of resistive devices configured to act as a voltage divider. The voltage created on the first internal node (ED1) 64 activates low-threshold n-channel transistor 24 to act as a pass gate to pass the voltage on the first internal node (ED1) 64 to a second internal node (ED2) 66. Low-threshold n-channel transistor 24 passes voltage until it is reverse-biased by a predetermined magnitude of voltage that is generated on the second internal node (ED2) 66. The reverse bias condition occurs when the predetermined magnitude of voltage exceeds the magnitude of voltage passed by the low-threshold n-channel transistor 24. Those skilled in the art would recognize that low-threshold n-channel transistor 24 operates as a diode in the preferred embodiment.

Voltage is also provided to the second internal node (ED2) 66 when z-device n-channel transistor 28 is activated by the wordline voltage that is supplied on a wordline voltage supply line (ERSELBVT) 70. Once activated, z-device n-channel transistor 28 operates as a throttle to control the magnitude of the voltage passed to the second internal node (ED2) 66. The magnitude of voltage supplied to the second internal node (ED2) 66 by z-device n-channel transistor 28 is approximately equal to the magnitude of the wordline voltage that activates z-device n-channel transistor 28. Those skilled in the art would recognize that the maximum magnitude of voltage that can be supplied to the second internal node (ED2) 66 by z-device n-channel transistor 28 is about equal to the supply voltage (Vcc) 54.

Since the second internal node (ED2) 66 is also supplied voltage from the resistor chain 48, z-device n-channel transistor 28 will not be activated to pass voltage to the second internal node (ED2) 66 until the predetermined wordline voltage exceeds the voltage supplied by the resistor chain 48. Z-device n-channel transistor 28 is a low-threshold z-device and is therefore formed to have a threshold voltage of about zero volts. Those skilled in the art would understand that the magnitude of voltage present at the control gate of z-device n-channel transistor 28 must exceed the voltage present at the source of z-device n-channel transistor 28 before current will flow. When z-device n-channel transistor 28 is activated and begins passing some magnitude of voltage to the second internal node (ED2) 66, low-threshold n-channel transistor 24 is deactivated. Low-threshold n-channel transistor 24 is deactivated since the magnitude of voltage on the internal node (ED2) 66 exceeds the magnitude of voltage passed by low-threshold n-channel transistor 24.

The second internal node (ED2) 66 is also electrically connected with the ground connection 56 by n-channel transistor 22 that is activated by the supply voltage (Vcc) 54. Since n-channel transistor 22 is highly resistive when activated, only minimal current flows from the second internal node (ED2) 66 to the ground connection 56. N-channel transistor 22 dissipates voltage remaining on the second internal node (ED2) 66 to about zero volts once the voltage control logic circuit 14 is deactivated.

The magnitude of voltage present on the second internal node (ED2) 66 is supplied as the control voltage on the voltage control line (VCX) 58 that is electrically connected with the decoder circuits 16. The preferred voltage control logic circuit 14 also directs the supply voltage (Vcc) 54 to the voltage control line (VCX) 58 with p-channel transistor 38 when the flash memory 10 is not in the array VT test mode. The remaining lines illustrated in the preferred voltage control logic circuit 14 are activated by the user to provide predetermined voltages on the voltage control line (VCX) 58 and a voltage control for erase verity line (VCXE) 68. The voltage control line (VCX) 58 and the voltage control for erase verify line (VCXE) 68 operate during other modes of operation that do not pertain to array VT testing.

Figure 3:
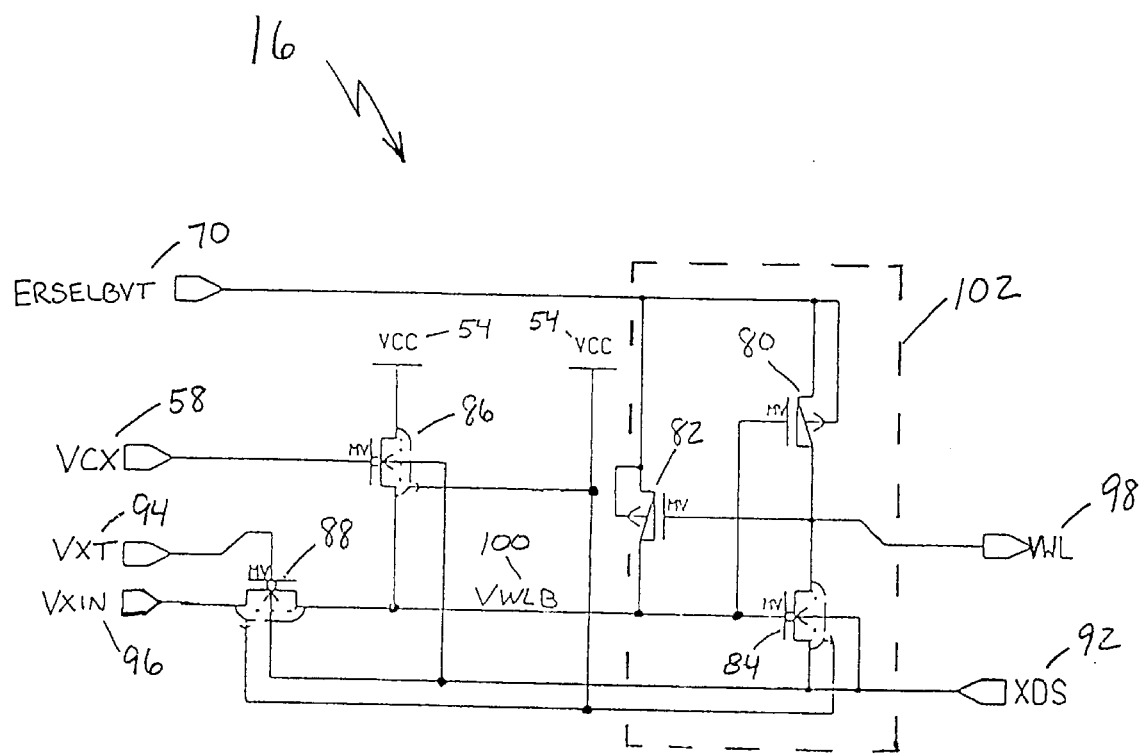
FIG. 3 represents a circuit schematic of a decoder circuit of the preferred embodiment of the present invention.

FIG. 3 illustrates a circuit schematic of one of the decoder circuits 16 used in the preferred embodiment of the present invention. In general, one of the preferred decoder circuits 16 comprises a plurality of p-channel enhancement transistors 80–82 and a plurality of triple-well n-channel transistors 84–88 that are electrically connected as illustrated in FIG. 3. Each of the decoder circuits 16 is also electrically connected with the supply voltage (Vcc) 54, an x-decoder source line (XDS) 92, an address line (VXT) 94 and a pull-down line (VXIN) 96 as illustrated. Though not illustrated, the preferred decoder circuits 16 are also electrically connected with the wordline voltage supply 12 by the wordline voltage supply line (ERSELBVT) 70. The decoder circuits 16 are also electrically connected with the wordlines 18 by a wordline voltage line (VWL) 98.

In the preferred embodiment, the decoder circuits 16 are activated by the control voltage on the voltage control line (VCX) 58. The decoder circuits 16 are also supplied the wordline voltage generated by the wordline voltage supply 12 on the wordline voltage supply line (ERSELBVT) 70. In addition to being activated, a particular decoder circuit 16 is electrically selected by a conducting electric signal generated on the address line (VXT) 94. The particular decoder circuit 16 must be activated and selected in order to decode the respective wordlines 18. The predetermined electric signal on the address line (VXT) 94 activates transistor 88 to electrically connect an internal node (VWLB) 100 with the pull-down line (VXIN) 96. The magnitude of the voltage present on the internal node (VWLB) 100 also controls the activation of triple-well n-channel transistor 84. Triple-well n-channel transistor 84 electrically connects the x-decoder source line (XDS) 92 with the wordline voltage line (VWL) 98 when activated. The x-decoder source line (XDS) 92 of the selected decoder circuit 16, and the pull-down line (VXIN) 96 of all the decoder circuits 16, are lowered to approximately zero volts by electrical connection with a ground connection (not shown) during the array VT test mode.

As further illustrated in FIG. 3, the wordline voltage supply line (ERSELBVT) 70 is electrically connected with the source and well of p-channel enhancement transistor 80 and the source and well of p-channel enhancement transistor 82. P-channel enhancement transistors 80, 82 and triple-well n-channel transistor 84 are electrically connected to form a half-latch 102. The voltage present on the wordline voltage supply line (ERSELBVT) 70 is transferred to the wordline voltage line (VWL) 98 when the half-latch 102 trips. The half-latch 102 is tripped when the respective decoder circuit 16 is activated and selected such that the respective internal node (VWLB) 100 is lowered to about zero volts.

In the preferred embodiment, the decoder circuits 16 are activated by the control voltage on the voltage control line (VCX) 58. The control voltage activates triple-well n-channel transistor 86 to transfer a magnitude of voltage that creates the activation voltage on the internal node (VWLB) 100. The activation voltage is generated as a result of triple-well n-channel transistor 86 controlling the magnitude of the supply voltage (Vcc) 54.

When the address line (VXT) 94 of the selected decoder circuit 16 is provided a conducting electric signal, triple-well n-channel transistor 88 is activated and the internal node (VWLB) is pulled down to about zero volts. This trips the half-latch 102 by activating p-channel enhancement transistor 80 and deactivating triple-well n-channel transistor 84. Those skilled in the art would recognize that by making triplewell n-channel transistor 86 capable of transferring only a predetermined low current when activated, the internal node (VWLB) 100 within the selected decoder circuit 16 can be pulled down to about zero volts with minimal power consumption. Those skilled in the art would also recognize that the selected decoder circuit 16 will not be forward-biased since internal node (VWLB) 100 is lowered to about zero volts.

The control voltage is supplied to the voltage control line (VCX) 58 of the selected decoder circuit 16 and to the voltage control line (VCX) 58 of the unselected decoder circuits 16. The internal nodes (VWLB) 100 of the selected and unselected decoder circuits 16 are raised to the activation voltage. Within the unselected decoder circuits 16, p-channel enhancement transistor 80 is deactivated and triple-well n-channel transistor 84 is activated, thereby electrically connecting the x-decoder source line (XDS) 92 with the wordline voltage line (VWL) 98.

To avoid forward bias of the unselected decoder circuits 16 in the preferred embodiment, the activation voltage on the internal nodes (VWLB) 100 of the unselected decoder circuits 16 corresponds to the wordline voltage on the wordline voltage supply line (ERSELBVT) 70. The source and well of p-channel enhancement transistor 82 within the half-latch 102 is subjected to the wordline voltage, while the drain of p-channel enhancement transistor 82 is subjected to the activation voltage present on the internal node (VWLB) 100. As such, p-channel enhancement transistor 82 is forward-biased if the magnitude of the predetermined activation voltage is allowed to exceed the wordline voltage by a predetermined voltage level that is capable of being calculated by those skilled in the art. Those skilled in the art would also recognize that since the supply voltage (Vcc) 54 is supplied to both the voltage control logic circuit 14 and the decoder circuits 16, operational fluctuations in the magnitude of the supply voltage (Vcc) 54 will not affect activation of the decoder circuits 16 as each will be impacted equally.

Referring once again to FIG. 1, as previously set forth, the preferred embodiments of the present invention discloses methods and systems for activating the decoders 16 to transfer the wordline voltage to the wordlines 18 during the array VT test mode. When the preferred flash memory 10 is placed in the array VT test mode, the wordline voltage supply 12 generates a wordline voltage and the voltage control logic circuit 14 is activated. The voltage control logic circuit 14 generates a control voltage to activate the decoder circuits 16 using the supply voltage (Vcc) based on the wordline voltage generated by the wordline voltage supply 12.

In the preferred embodiment, the control voltage is generated by the voltage control logic circuit 14 with either low-threshold n-channel transistor 24 or the resistor chain 48 illustrated in FIG. 2. When the wordline voltage is less than the voltage generated by the resistor chain 48 on the second internal node (ED2) 66, the minimum control voltage is generated. The preferred minimum control voltage varies from about 2.7 to 3.3 V and is generated by the resistor chain 48 on the voltage control line (VCX) 58.

The activation voltage that is controlled by the minimum control voltage can activate the decoder circuits 16 without causing reverse bias problems as previously set forth. Those skilled in the art would recognize that the minimum control voltage and the corresponding minimum activation voltage is dependent on the decoder circuit design and that these voltages can be calculated by those skilled in the art. In the preferred embodiment of the present invention, the minimum control voltage activates the decoder circuits 16 with an activation voltage that is about thirty-four percent of the supply voltage (Vcc) 54 when the supply voltage (Vcc) 54 is about 5 V.

When the wordline voltage supplied by the wordline voltage supply 12 is at or above the minimum control voltage generated by the resistor chain 48, z-device n-channel transistor 28 is activated and the resistor chain 48 is deactivated. Z-device n-channel transistor 28 controls the supply voltage (Vcc) 54 to generate a magnitude of the control voltage that is about equal to the wordline voltage supplied by the wordline voltage supply 12. As the wordline voltage is varied to characterize the selected memory cells, either the resistor chain 48 or the z-device n-channel transistor 28 is used to activate the decoder circuits 16. The decoder circuits 16 are activated with the control voltage that is varied within the second voltage range as previously set forth.

Since the magnitude of the supply voltage (Vcc) 54 that activates the decoder circuits 16 is controlled, a particular decoder circuit 16 can be selected to decode the wordlines 18 without forward biasing the unselected decoder circuits 16. Those skilled in the art would recognize that when the predetermined wordline voltage is varied to greater than about one hundred percent of the supply voltage (Vcc) 54, the control voltage generated is about equal to the supply voltage (Vcc) 54. In the preferred embodiment, when the control voltage is about equal to the supply voltage (Vcc) 54, the activation voltage that activates the decoder circuits 16 is about eighty percent of the supply voltage (Vcc) 54. Those skilled in the art would also recognize that the resistance of the transistors and circuits would affect the magnitude of the voltages of the preferred embodiment.

Referring now to FIG. 3, the wordline voltage and the control voltage are directed to the decoder circuits 16 on the wordline voltage supply line (ERSELBVT) 70 and the voltage control line (VCX) 58, respectively. The control voltage allows a corresponding activation voltage to activate the decoder circuits 16 as previously set forth. The decoder circuit 16 that decodes the wordlines 18 that contains the memory cells selected to be characterized is selected by a conducting electric signal generated by the user. The selected decoder circuit 16 receives the conducting electric signal on the address line (VXT) 94 and triple-well n-channel transistor 88 is activated.

When triple-well n-channel transistor 88 is activated, the half-latch 102 of the selected decoder circuit 16 trips and the wordline voltage is transferred to the decoded wordlines 18 on the wordline voltage line (VWL) 98. The control voltage that is provided to the unselected decoder circuits 16 activates triple-well n-channel transistor 86. When activated, triple-well n-channel transistor 86 transfers the activation voltage to the internal node (VWLB) 100 that will not forward bias p-channel enhancement transistor 82 of the half-latch 102. The preferred embodiment of the present invention allows the memory cells to be read and the current measured for any magnitude of wordline voltage within a broad range defined by the first voltage range. In addition, the wordline voltage can be successfully transferred to the wordlines 18 as the supply voltage (Vcc) 54 fluctuates due to the operation of the flash memory 10.

While the invention has been described in its currently best known modes of operation and embodiments, other modes and embodiments of the invention will be apparent to those skilled in the art and it is the following claims, including all equivalents, that are intended to define the spirit and scope of the invention.

What is claimed is:

1. A method of supplying voltage to a plurality of wordlines in a memory device, comprising the steps of:

generating a predetermined wordline voltage with a wordline voltage supply;

supplying said predetermined wordline voltage to at least one decoder circuit; and activating said decoder circuit with a predetermined control voltage generated by a voltage control logic circuit to transfer said predetermined wordline voltage to at least one wordline during array VT testing.

2. The method of claim 1, wherein said predetermined wordline voltage is about 1.2–6 V.

3. The method of claim 1, further comprising the step of electrically selecting said decoder circuit prior to transferring said predetermined wordline voltage.

4. The method of claim 1, further comprising the step of varying said predetermined control voltage within a second predetermined range to correspond to said predetermined wordline voltage.

5. The method of claim 1, wherein said predetermined control voltage is about sixty percent of a supply voltage (Vcc) when said predetermined wordline voltage is less than about sixty percent of said supply voltage (Vcc).

6. The method of claim 1, wherein said predetermined control voltage is about equal to said predetermined wordline voltage when said predetermined wordline voltage is between about sixty percent of a supply voltage (Vcc) and about one hundred percent of said supply voltage (Vcc).

7. The method of claim 1, wherein said predetermined control voltage is about equal to a supply voltage (Vcc) when said predetermined wordline voltage is greater than about one hundred percent of said supply voltage (Vcc).

8. The method of claim 1, wherein said predetermined control voltage controls the magnitude of a supply voltage (Vcc) that activates said decoder circuit.

9. The method of claim 1, wherein array VT testing occurs during an array VT test mode.

10. A method of decoding wordlines in a memory device, comprising the steps of:

entering an array VT test mode;

generating a predetermined wordline voltage with a wordline voltage supply;

activating a voltage control logic circuit to generate a predetermined control voltage; and transferring said predetermined wordline voltage to at least one wordline decoded by at least one decoder circuit activated by said predetermined control voltage.

11. The method of claim 10, wherein said predetermined wordline voltage is about 1.2–6.0 V.

12. The method of claim 10, further comprising the step of varying said predetermined control voltage to correspond to said predetermined wordline voltage.

13. The method of claim 10, wherein said predetermined control voltage is about sixty percent of a supply voltage (Vcc) when said predetermined wordline voltage is less than about sixty percent of said supply voltage (Vcc).

14. The method of claim 10, wherein said predetermined control voltage is about equal to said predetermined wordline voltage when said predetermined wordline voltage is between about sixty percent of a supply voltage (Vcc) and about one hundred percent of said supply voltage (Vcc).

15. The method of claim 10, wherein said predetermined control voltage is about equal to a supply voltage (Vcc) when said predetermined wordline voltage is greater than about one hundred percent of said supply voltage (Vcc).

16. The method of claim 10, wherein said predetermined control voltage controls the magnitude of a supply voltage (Vcc) that activates said decoder circuit.

17. A wordline decoding system to transfer voltage to wordlines in a memory device, comprising:

a wordline voltage supply to generate a predetermined wordline voltage;

at least one decoder circuit electrically connected with said wordline voltage supply and at least one wordline, wherein said decoder circuit transfers said predetermined wordline voltage to said wordline; and a voltage control logic circuit electrically connected with said wordline voltage supply and said decoder circuit, wherein said voltage control logic circuit activates said decoder circuit with a predetermined control voltage during array VT testing.

18. The wordline decoding system of claim 17, wherein said predetermined wordline voltage is about 1.2–6.0 V.

19. The wordline decoding system of claim 17, wherein said predetermined control voltage is varied to correspond to said predetermined wordline voltage.

20. The wordline decoding system of claim 17, wherein said predetermined control voltage is about sixty percent of a supply voltage (Vcc) when said predetermined wordline voltage is less than about sixty percent of said supply voltage (Vcc).

21. The wordline decoding system of claim 17, wherein said predetermined control voltage is about equal to said predetermined wordline voltage when said predetermined wordline voltage is between about sixty percent of a supply voltage (Vcc) and about one hundred percent of said supply voltage (Vcc).

22. The wordline decoding system of claim 17, wherein said predetermined control voltage is about equal to a supply voltage (Vcc) when said predetermined wordline voltage is greater than about one hundred percent of said supply voltage (Vcc).

23. The wordline decoding system of claim 17, wherein said predetermined control voltage controls the magnitude of a supply voltage (Vcc) that activates said decoder circuit.

24. The wordline decoding system of claim 17, wherein array VT testing occurs during an array VT test circuit.

* * * * *